(12) United States Patent
Ootani

(10) Patent No.: US 12,237,838 B2
(45) Date of Patent: Feb. 25, 2025

(54) SEMICONDUCTOR DEVICE

(71) Applicant: RENESAS ELECTRONICS CORPORATION, Tokyo (JP)

(72) Inventor: Takayuki Ootani, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 27 days.

(21) Appl. No.: 18/303,960

(22) Filed: Apr. 20, 2023

(65) Prior Publication Data

US 2023/0387901 A1  Nov. 30, 2023

(30) Foreign Application Priority Data

May 30, 2022  (JP) .................. 2022-087448

(51) Int. Cl.
*G06F 11/16* (2006.01)
*H03K 5/131* (2014.01)

(52) U.S. Cl.
CPC ......... *H03K 5/131* (2013.01); *G06F 11/1641* (2013.01); *G06F 11/1695* (2013.01)

(58) Field of Classification Search
None
See application file for complete search history.

(56) References Cited

U.S. PATENT DOCUMENTS

| | | | | |
|---|---|---|---|---|
| 5,915,082 | A * | 6/1999 | Marshall | G06F 11/10 |
| | | | | 714/E11.061 |
| 6,065,135 | A * | 5/2000 | Marshall | G06F 11/1044 |
| | | | | 714/E11.061 |
| 6,938,183 | B2 * | 8/2005 | Bickel | G06F 11/1658 |
| | | | | 714/E11.069 |
| 9,891,917 | B2 * | 2/2018 | Hastie | G06F 11/0793 |
| 10,089,194 | B2 * | 10/2018 | Jain | G06F 11/1604 |
| 10,802,932 | B2 * | 10/2020 | Refaeli | G06F 11/1629 |
| 10,901,865 | B2 * | 1/2021 | Bryant | G06F 11/1675 |
| 11,327,853 | B2 * | 5/2022 | Yamazaki | G06F 11/0724 |
| 11,474,151 | B2 * | 10/2022 | Viswanathan Pillai | |
| | | | | H03K 19/003 |
| 2008/0244305 | A1 | 10/2008 | Troppmann et al. | |
| 2016/0283314 | A1 * | 9/2016 | Thanner | G06F 11/0793 |
| 2017/0357557 | A1 * | 12/2017 | Jain | G06F 11/1641 |
| 2019/0171536 | A1 * | 6/2019 | Refaeli | G06F 11/203 |
| 2024/0142518 | A1 * | 5/2024 | Mcnairy | G06F 11/1641 |

* cited by examiner

*Primary Examiner* — Thomas J. Hiltunen
(74) *Attorney, Agent, or Firm* — Rimon P.C.

(57) ABSTRACT

A technique for enhancing reliability is provided. A semiconductor device includes a main device which operates in a delayed lockstep mode, a sub device which operates in parallel to the main device in a delayed lockstep mode, a delay circuit which delays an output of the main device, a switching circuit which switches the main device to the sub device according to failure information of the main device.

9 Claims, 12 Drawing Sheets

SEMICONDUCTOR DEVICE

CROSS-REFERENCE TO RELATED APPLICATIONS

The disclosure of Japanese Patent Application No. 2022-087448 filed on May 30, 2022 including the specification, drawings and abstract is incorporated herein by reference in its entirety.

BACKGROUND

The present disclosure relates to a semiconductor device and, for example, is applicable to a semiconductor device which performs a lockstep operation.

There is disclosed a technique listed below.
[Patent Document 1] US Unexamined Patent Application Publication No. 2008/0244305

As one of techniques for increasing reliability of a semiconductor device, a lockstep technique which causes two central processing unit (CPU) cores to run in the same cycle and causes the two CPU cores to execute the same processing is proposed. For example, Patent Document 1 discloses such an electronic device in a delayed lockstep mode that causes an output from one CPU core to be delayed by a delay circuit and causes an input of another CPU core to be delayed by a delay circuit to thereby alleviate timing constraints of a critical path.

SUMMARY

However, the electronic device disclosed in Patent Document 1 is unable to continue operations in the event of a failure in hardware constituting a CPU core, and therefore, reliability cannot be sufficiently improved.

Other objects and novel characteristics of the present disclosure will be apparent from the description of the present specification and the accompanying drawings.

An outline of the typical ones of the present disclosure will briefly be described as follows. Specifically, the semiconductor device includes a main device which operates in a delayed lockstep mode, a sub device which operates in parallel to the main device in a delayed lockstep mode, a delay circuit which delays an output of the main device, a switching circuit which switches the main device to the sub device according to failure information of the main device.

According to the semiconductor device described above, reliability of the semiconductor device can be enhanced.

DETAILED DESCRIPTION

Figure 1:
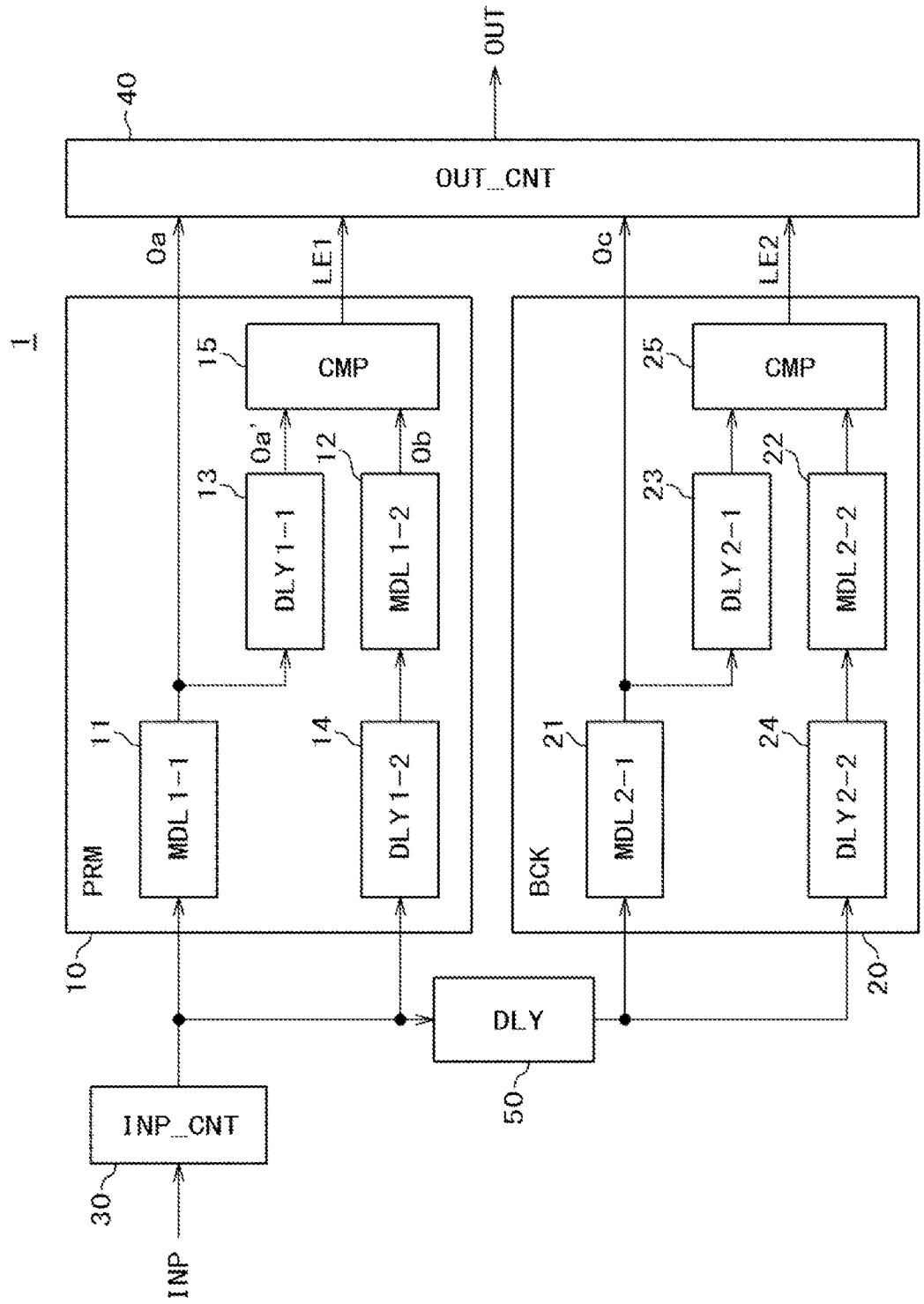
FIG. 1 is a block diagram showing a configuration of a fail operational system according to a first embodiment.

Hereinafter, embodiments and examples will be described with reference to the drawings. However, in the following description, the same components may be denoted by the same reference numerals, and a repetitive description thereof may be omitted.

An in-car electronic control unit (ECU) has been making a transition from a fail safe system to a fail operational (continuous operation in the event of failure) system. The fail safe system switches to a predetermined safe state when a failure occurs. The fail operational system secures a function of executing an operation to some degree, even in the event of failure in the function of executing the operation.

The fail operational system is achieved by a hot standby system that is one of duplex systems serving as a redundant system, for example. In the hot standby system, a primary system executes an operation until a trouble is detected by a diagnostic function. At this time, a backup system operates in parallel with the primary system. In a case in which a trouble is detected, the backup system takes over the role of the primary system.

In the present embodiment, a device (DDDC device) in which a delayed lockstep technique is applied to both the primary system and the backup system builds the fail operational system. Here, DDDC is the abbreviation for Duo Duplex Delayed Comparison. In the following, two embodiments will be described.

First Embodiment

A fail operational system according to the first embodiment will be described with reference to FIG. 1. FIG. 1 is a block diagram showing a configuration of a semiconductor device according to the first embodiment.

The fail operational system according to the first embodiment includes a DDDC device 1. The DDDC device 1 includes a primary block (PRM) 10, a backup block (BCK) 20, an input control circuit (INP_CNT) 30, an output control circuit (OUT_CNT) and a delay circuit (DLY) 50.

The primary block 10 includes a first module (MDL1-1) 11, a second module (MDL1-2) 12, a first delay circuit (DLY1-1) 13, a second delay circuit (DLY1-2) 14, and a comparator (CMP) 15. The second module 12 has a performance and a function equivalent to the first module 11. The second module 12 executes the same processing as that executed by the first module 11 more slowly than the first module 11 by an amount of delay generated by the second delay circuit (DLY1-2) 14. The first module 11 and the second module 12 operate in synchronization with a clock. An amount of delay of each of the first delay circuit (DLY1-1) 13 and the second delay circuit (DLY1-2) 14 is the same number of clock cycles.

The backup block 20 has a configuration equivalent to the primary block 10 and operates as in the primary block 10. Specifically, the backup block 20 includes a first module (MDL2-1) 21, a second module (MDL2-2) 22, a first delay circuit (DLY2-1) 23, a second delay circuit (DLY2-2) 24, and a comparator (CMP) The first module 21 has a performance and a function equivalent to the first module 11 and the second module 12 in the primary block 10. The second module 22 has a performance and a function equivalent to the first module 21. The second module 22 executes the same processing as that executed by the first module 21 more slowly than the first module 21 by an amount of delay generated in the second delay circuit (DLY2-2) 24. The first module 21 and the second module 22 operate in synchronization with a clock. An amount of delay of each of the first delay circuit (DLY2-1) 23 and the second delay circuit (DLY2-2) 24 is the same number of clock cycles. An amount of delay of each of the first delay circuit (DLY2-1) 23 in the backup block 20 and the first delay circuit (DLY1-1) 13 in the primary block 10 is the same number of clock cycles.

An input signal (INP) is input to the primary block 10 through the input control circuit 30 and is input to the backup block 20 through the input control circuit 30 and the delay circuit 50. At a common time, the backup block 20 performs an operation equivalent to that of the primary block 10. At a normal time, the output control circuit 40 selects an output signal (Oa) from the first module 11 in the primary block 10 to output this signal as an output signal (OUT). When the comparator 15 detects a trouble in the primary block 10, the output control circuit 40 selects an output signal (Oc) from the first module 21 in the backup block 20 to output this signal as the output signal (OUT).

The second delay circuit 14 causes the second module 12 to be delayed relative to the first module 11 in the primary block 10. The first delay circuit 13 causes an output of the first module 11 to be delayed. The comparator 15 compares an output signal (Oa') from the first delay circuit 13 with an output signal (Ob) from the second module 12, and in a case in which there is a mismatch between the output signal (Oa') and the output signal (Ob), the comparator 15 detects the mismatch as a failure.

A signal input to the backup block 20 is input in such a manner as to be delayed relative to the input signal (INP) input to the primary block 10, and accordingly, an operation of the backup block 20 is delayed relative to the primary block 10. Hence, a time difference between an operation of the primary block 10 and an operation of the backup block 20 is generated, and within the time difference, the output control circuit 40 can cause the backup block 20 to take over the operation of the primary block 10. An amount of delay of the delay circuit (DLY) is equivalent to the number of clock cycles equal to or more than the amount of delay of the first delay circuit 13.

With use of the comparison result obtained by the comparator 15 of the primary block 10, the input control circuit controls the input signal to the primary block 10, and the output control circuit 40 controls the output signal from the primary block 10. Hence, the output of false information from the DDDC device 1 can be prevented. Also, during a period of time for a takeover from the primary block 10 to the backup block a protocol with an external device outside the DDDC device 1 can be maintained. Here, the protocol means a bus protocol using, for example, a data signal, a valid signal (VLD), and a ready signal (RDY). The valid signal (VLD) represents that a sender side presents data that is valid for a data signal. The ready signal (RDY) represents that a receiver side can receive data of the data signal.

The delayed lockstep technique is applied to the primary block 10 and the backup block 20. Accordingly, it is possible to prevent omission of a failure detection due to lowering of resistance against a common cause failure attributable to distribution of the same signal in each of the primary block 10 and the backup block 20. Here, as an example of the common cause failure, inversion of a state caused by a common clock voltage drop, inversion of a state caused by a voltage drop of a power supply due to simultaneous operation of a plurality of modules, inversion of a state caused by the cosmic ray (a ray), and the like.

Moreover, since the delay circuit 50 is provided, it is possible to prevent a common cause failure such as a noise from propagating from the primary block 10 to the backup block 20.

EXAMPLES

Hereinafter, some typical examples according to the first embodiment will be provided. In the following descriptions regarding the examples, components having the same configuration and function as those of the first example are denoted by the same reference numerals as those of the first example. In addition, the description of the first example may appropriately be incorporated into the descriptions of the components having the same configuration and function as those of the first example as long as there is no technical inconsistency. Also, the multiple examples are entirely or partially applicable in appropriate combination as long as there is no technical inconsistency.

First Example

Figure 2:
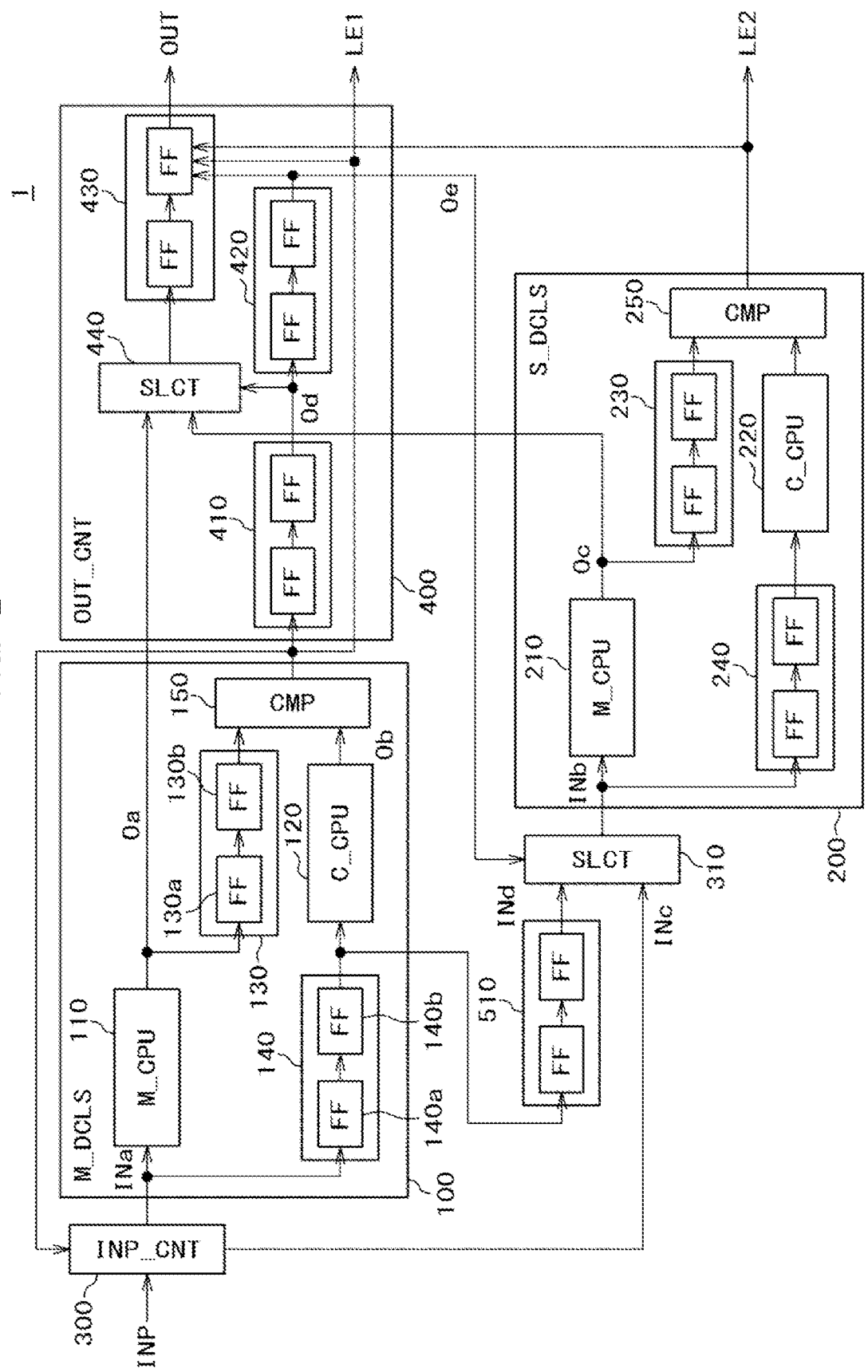
FIG. 2 is a block diagram showing a configuration of a semiconductor device according to a first example of the first embodiment.

FIG. 2 is a block diagram showing a configuration of a semiconductor device according to the first example.

The semiconductor device of the first example is, for example, a micro controller unit (MCU), and includes the DDDC device 1. The DDDC device 1 in the first example includes a main device (M_DCLS) 100, a sub device (S_DCLS) 200, an input control circuit (INP_CNT) 300, an output control circuit (OUT_CNT) 400, a delay circuit 510, and a selector (SLCT) 310. The main device 100 corresponds to the primary block 10 in the first embodiment. The sub device 200 corresponds to the backup block 20 in the first embodiment. The DDDC device is referred to as a dual DCLS device as well. Here, DCLS is the abbreviation for Dual Core Lock Step.

The delay circuit 510 in the first example corresponds to the function of the delay circuit 50 in the first embodiment. In addition, the selector 310 in the first example corresponds to part of the function of the input control circuit 30 in the first embodiment.

The main device 100 includes a master CPU (M_CPU) 110, a checker CPU (C_CPU) 120, a first delay circuit 130, a second delay circuit 140, and a comparator (CMP) 150. The master CPU 110 corresponds to the first module 11 in the first embodiment. The checker CPU 120 corresponds to the second module 12 in the first embodiment. The first delay circuit 130, the second delay circuit 140, and the comparator 150 correspond to the first delay circuit 13, the second delay circuit 14, and the comparator 15 in the first embodiment, respectively. The main device 100 performs a delayed lockstep operation.

The sub device 200 includes a master CPU (M_CPU) 210, a checker CPU (C_CPU) 220, a first delay circuit 230, a second delay circuit 240, and a comparator (CMP) 250. The master CPU 210 corresponds to the first module 21 in the first embodiment. The checker CPU 220 corresponds to the second module 22 in the first embodiment. The first delay circuit 230, the second delay circuit 240, and the comparator 250 correspond to the first delay circuit 23, the second delay circuit 24, and the comparator 25 in the first embodiment, respectively. The sub device 200 performs a delayed lockstep operation.

In the delayed lockstep operation, a command same as that processed by the master CPU 110 or 210 is processed by the checker CPU 120 or 220 in a delayed manner by several clock cycles. Accordingly, in the delayed lockstep operation, strictly speaking, the same command is not processed in the same clock cycle, but the same command is processed in different CPUs. This is one aspect of the lockstep operation. Note that, in the following, the master CPU 110 or 210 and the checker CPU 120 or 220 perform the delayed lockstep operation in which the checker CPU 120 or 220 performs the lockstep operation in a delayed manner with respect to the master CPU 110 or 210 by two clock cycles. However, a difference in clock cycle between the master CPU 110 or 210 and the checker CPU 120 or 220 is not limited to two clock cycles.

The semiconductor device in the first example further includes a shared memory such as a RAM (Random Access Memory) and a flush memory as well as a peripheral circuit and the like, which are not illustrated. The shared memory and the peripheral circuit are one of shared resources to be used in a shared manner by the master CPUs 110 and 210 and the checker CPUs 120 and 220. In addition, the shared memory described above is merely an example, and only some of the above-described memories may be provided as the shared memory. Also, a memory other than the memories described above may be provided. The shared memory stores, for example, a program or data to be executed by the master CPUs 110 and 210 and the checker CPUs 120 and 220. Note that the shared memory and the peripheral circuits are both the shared resources, and it may be sufficient if at least one of them is provided. An output of the shared resource is input to the input control circuit 300, and an output of the output control circuit 400 is input to the shared resource.

The comparator 150 outputs a comparison result signal (LE1) outside the output control circuit 400 and the DDDC device 1. The comparator 250 outputs a comparison result signal (LE2) outside the output control circuit 400 and the DDDC device 1. The delay circuit 130 includes two-stage flip-flop circuits (FF) 130a and 130b. The delay circuit 140 includes two-stage flip-flop circuits 140a and 140b. The delay circuits 230 and 240 have configurations similar to the delay circuits 130 and 140, respectively. That is, each of the delay circuits 130, 140, 230, and 240 forms a delay of two clock cycles. An output of the delay circuit 140 is input to the delay circuit 510 including a two-stage flip-flop circuit.

The output control circuit 400 includes the delay circuits 410, 420, and 430 and a selector 440 as a switching circuit. The delay circuits 410, 420, and 430 each includes a two-stage flip-flop circuit. That is, each of the delay circuits 410, 420, and 430 forms a delay of two clock cycles. The comparison result signal (LE1) of the comparator 150 is input to the delay circuit 410, and an output of the delay circuit 410 is input to the delay circuit 420. An output of the delay circuit 420 is input to a latter-stage flip-flop circuit of the delay circuit 430 and the selector 310. An output signal (Oa) of the master CPU 110 in the main device 100 and an output signal (Oc) of the master CPU 210 in the sub device 200 are input to the selector 440. The selector 440 is controlled by the output of the delay circuit 410. An output of the selector 440 is input to the delay circuit 430. The delay circuit 430 outputs an output signal (OUT).

An input signal (INP) is input through the input control circuit 300 to the main device 100 as an input signal (INa), and is input through the delay circuit 140, the delay circuit 510, and the selector 310, to the sub device 200 as an input signal (INb). Accordingly, the sub device 200 is delayed by four clock cycles relative to the main device 100. Note that not an output of the input control circuit 300, but the output of the delay circuit 140 is input to the delay circuit 510. Hence, the number of flip-flop circuits included in the delay circuit 510 can be reduced.

After a takeover to the sub device 200, the input signal (INb) to the sub device 200 is switched from a delay input signal (INd) to a delay-free input signal (INc) by the selector 310. The selector 310 is controlled by a signal (Oe) that is obtained by causing the comparison result signal (LE1) of the comparator 150 in the main device 100 to be delayed by four clock cycles through the delay circuits 410 and 420. Accordingly, the sub device 200 can operate at the same input latency as that at a time of operation of the main device 100.

The output signal (Oa) of the master CPU 110 in the main device 100 is output from the output control circuit 400 as the output signal (OUT) in such a manner that the output signal (Oa) is delayed by two clock cycles by the delay circuit 430. The latter-stage flip-flop circuit of the delay circuit 430 (the flip-flop circuit in the last stage in the output control circuit 400) is controlled by the comparison result signal (LE1) of the comparator 150 in the master CPU 110 and the comparison result signal (LE2) of the comparator 250 in the sub device 200.

According to the comparison result signal (LE1) of the comparator 150 in the master CPU 110, the output of the delay circuit 430 is suppressed. According to the signal (Oe) obtained causing the comparison result signal (LE1) of the comparator 150 in the master CPU 110 to be delayed by four clock cycles by the delay circuits 410 and 420, the output of the delay circuit 430 is resumed. In a case in which the comparison result signal (LE2) of the comparator 250 in the sub device 200 is not matched with the signal (Oe), the output of the delay circuit 430 is suppressed.

The selector 440 selects an output of the master CPU 110 in the main device 100 or the master CPU 210 in the sub device 200. The switching by the selector 440 is controlled by the signal (Od) obtained by causing the comparison result signal (LE1) of the comparator 150 in the master CPU 110 to be delayed by two clock cycles by the delay circuit 410. The output of the selector 440 is input to a former-stage flip-flop circuit of the delay circuit 430. Hence, the sub device 200 can operate at the same output latency as that at the time of operation of the main device 100.

Figure 3:
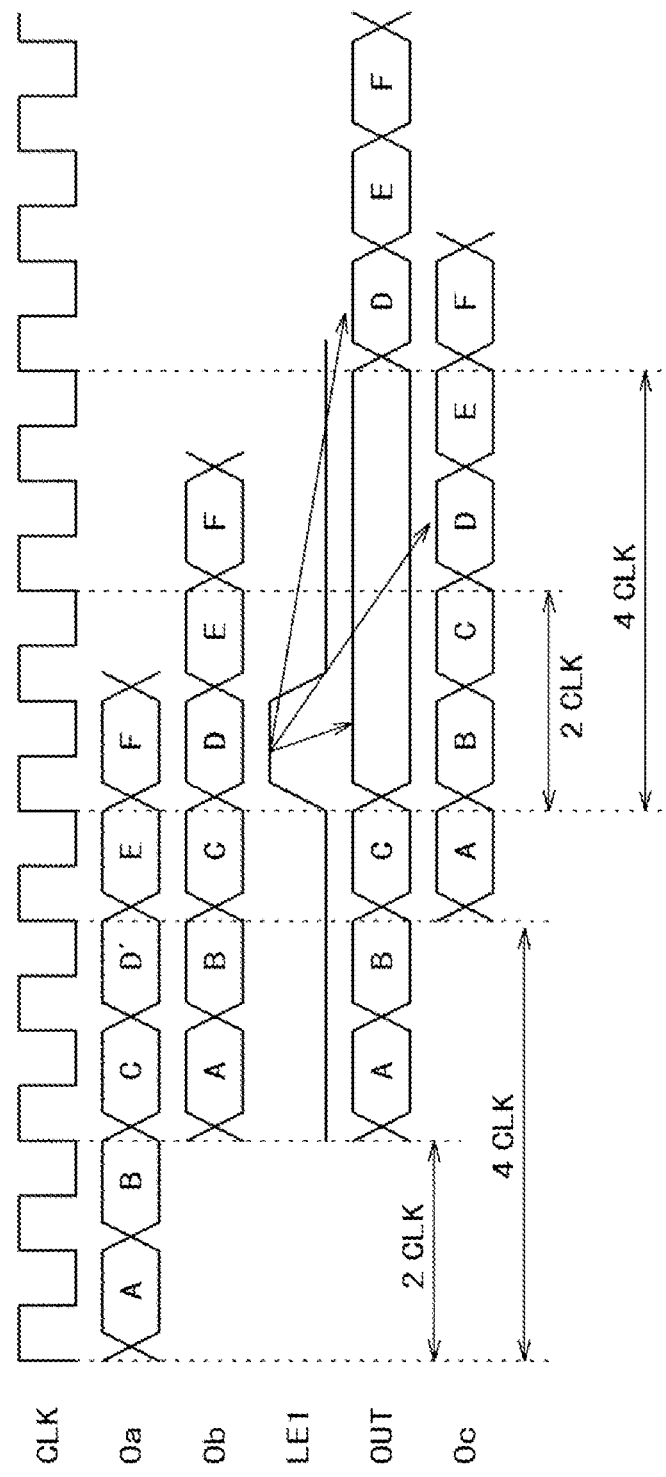
FIG. 3 is a timing chart indicating an operation of the semiconductor device shown in FIG. 2.

An operation in a case in which an error is detected in the main device 100 will be described with reference to FIG. 3. FIG. 3 is a timing chart indicating an operation of the semiconductor device shown in FIG. 2.

The output signal (Oa) of the master CPU 110, the output signal (Ob) of the checker CPU 120, the comparison result signal (LE1) of the comparator 150, the output signal (OUT), and the output signal (Oc) of the master CPU 210 are signals which are synchronized with rising of a clock (CLK).

In a case in which the main device operates normally, contents of the output signal (Oa) of the master CPU 110, the output signal (Ob) of the checker CPU 120, the output signal (OUT), and the output signal (Oc) of the master CPU 210 change in order of A, B, C, D, E, and F. In FIG. 3, a case in which the master CPU 110 has a failure and the contents of the output signal (Oa) of the master CPU 110 change in order of A, B, C, D', E, and F is indicated.

The output signal (Ob) of the checker CPU 120 in the main device 100 is delayed by two clock cycles (2CLK) relative to the output signal (Oa) of the master CPU 110. Also, the output signal (Oc) of the master CPU 210 in the sub device 200 is delayed by four clock cycles (4CLK) relative to the output signal (Oa) of the master CPU 110 in the main device 100.

In a case in which the output signal (Oa) of the master CPU 110 in the main device 100 is "D'" and the output signal (Ob) of the checker CPU 120 in the main device 100 is "D," the comparator 150 detects that there is a mismatch between the output signal (Oa) and the output signal (Ob), and the comparison result signal (LE1) is set to a high level, for example.

The comparison result signal (LE1) from the comparator 150 in the main device 100 controls the input/output of the DDDC device 1 (the input control circuit 300 and the output control circuit 400). According to the high level of the comparison result signal (LE1), for example, the ready signal (RDY) that is an input signal of a bus interface (IF) is set to a low level, and the valid signal (VLD) that is a signal of part of the output signal (OUT) is set to the low level. Accordingly, the CPUs 110, 120, 210, and 220 do not perform the subsequent process, and, for example, an address signal as the signal that is part of the output signal (OUT), the data signal, and the like become in valid.

According to the signal (Od) obtained by causing the comparison result signal (LE1) of the comparator 150 in the main device 100 to be delayed by two clock cycles (2CLK), the output signal (Oa) of the master CPU 110 in the main device 100 is switched to the output signal (Oc) of the master CPU 210 in the sub device 200.

According to the signal (Oe) obtained by causing the comparison result signal (LE1) of the comparator 150 in the main device 100 to be delayed by four clock cycles (4CLK), an input of the sub device 200 is switched to the delay-free input signal INc. According to the signal (Oe) obtained by causing the comparison result signal (LE1) of the comparator 150 in the main device 100 to be delayed by four clock cycles (4CLK), the output of the DDDC device 1 (the output of the delay circuit 430 in the output control circuit 400) becomes valid.

A clock of the master CPU 110 system and a clock in the checker CPU 120 system in the main device 100 are operated separately. Also, a clock of the master CPU 210 system and a clock in the checker CPU 220 system in the sub device 200 are operated separately. Hence, an erroneous operation caused by a clock voltage drop can be separated.

Here, the master CPU 110 system includes, in addition to the master CPU 110, the former-stage flip-flop circuit 130a of the delay circuit 130 and the former-stage flip-flop circuit 140a of the delay circuit 140. The checker CPU 120 system includes, in addition to the checker CPU 120, the latter-stage flip-flop circuit 130b of the delay circuit 130 and the latter-stage flip-flop circuit 140b of the delay circuit 140. The master CPU 210 system includes, in addition to the master CPU 210, the former-stage flip-flop circuit 230a of the delay circuit 230 and the former-stage flip-flop circuit 240a of the delay circuit 240. The checker CPU 220 system includes, in addition to the checker CPU 220, the latter-stage flip-flop circuit 230b of the delay circuit 230 and the latter-stage flip-flop circuit 240b of the delay circuit 240.

According to the delay circuit 140, the checker CPU 120 is delayed relative to the master CPU 110 by two clock cycles, so that a voltage drop of the power supply due to a simultaneous operation of the master CPU 110 and the checker CPU 120 can be avoided.

After distribution of the input signal, the input signal is received by the two-stage flip-flop circuit on the checker CPU 120 side, and it is possible to prevent a noise (for example, due to the cosmic ray) from propagating to the checker CPU 120 side.

Second Example

Figure 4:
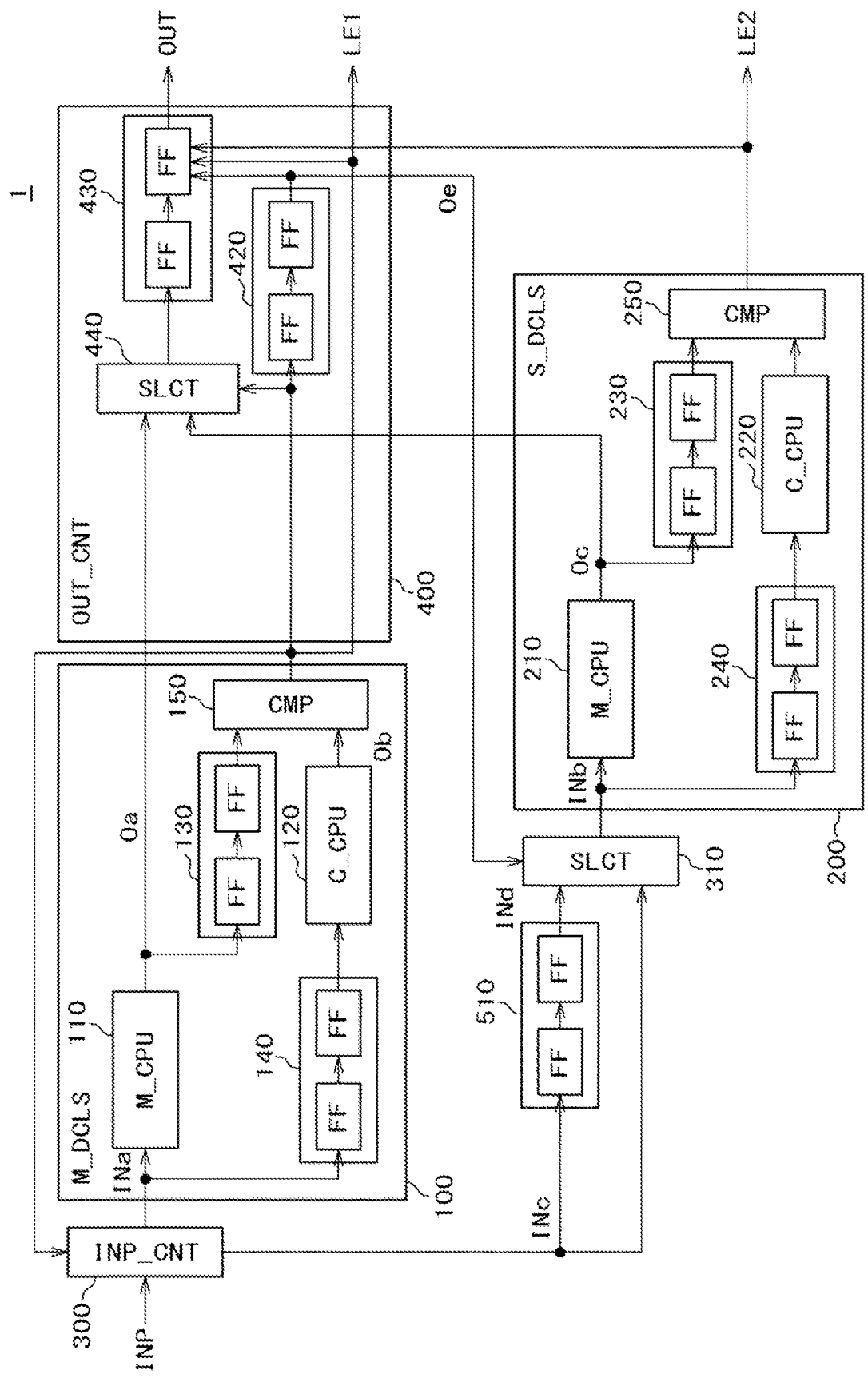
FIG. 4 is a block diagram showing a configuration of a semiconductor device according to a second example of the first embodiment.

FIG. 4 is a block diagram showing a configuration of a semiconductor device of a second example.

The sub device 200 in the first example operates in a delay of four clock cycles relative to the main device 100. In contrast, the sub device 200 in the second example operates in a delay of two clock cycles relative to the main device 100.

Accordingly, in the second example, the input signal (INc) that is not the output of the delay circuit 140, but the output of the input control circuit 300 is input to the delay circuit 510. Specifically, the input signal (INP) is input to the main device 100 through the input control circuit 300 as the input signal (INa), and is input through the delay circuit 510 and the selector 310 to the sub device 200 as the input signal (INb).

Also, the output control circuit 400 in the second example is not provided with the delay circuit 410 in the first example, and the output of the comparator 150 is input to the delay circuit 420. Other configurations (the main device 100, the sub device 200, and the input control circuit 300) of the DDDC device 1 in the second example are similar to those in the first example.

Figure 5:
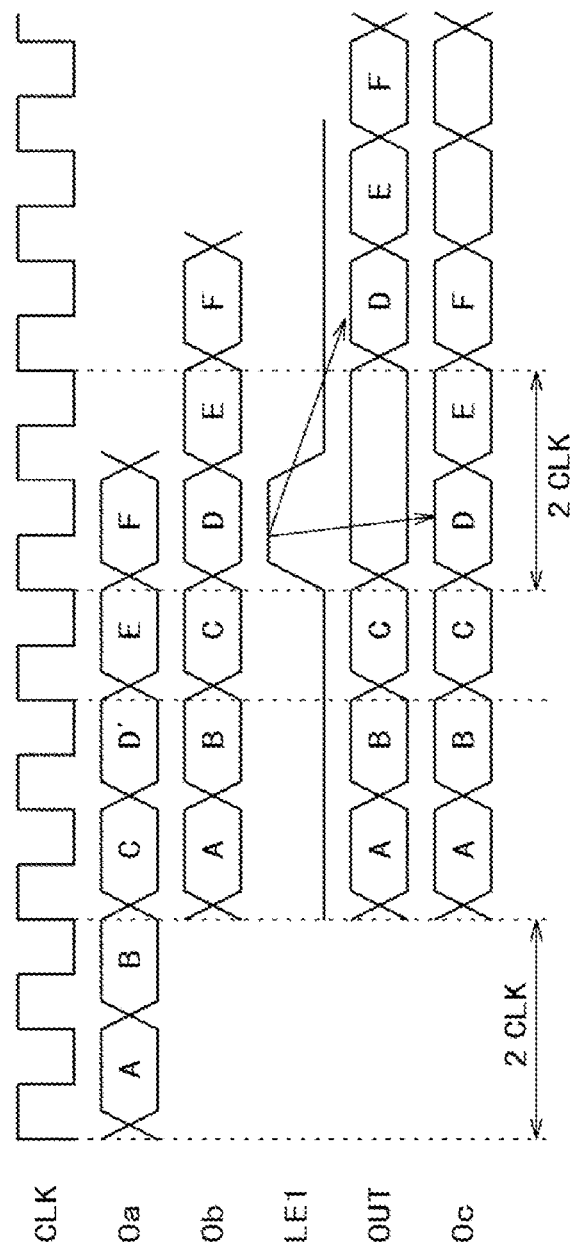
FIG. 5 is a timing chart indicating an operation of the semiconductor device shown in FIG. 4.

An operation in a case in which an error is detected in the main device 100 will be described with reference to FIG. 5. FIG. 5 is a timing chart indicating an operation of the DDDC device from the second example to a fourth example.

The output signal (Ob) of the checker CPU 120 in the main device 100 is delayed relative to the output signal (Oa) of the master CPU 110 by two clock cycles (2CLK). Also, the output signal (Oc) of the master CPU 210 in the sub device 200 is delayed relative to the output signal (Oa) of the master CPU 110 in the main device 100 by two clock cycles (2CLK).

In a case in which the output signal (Oa) of the master CPU 110 in the main device 100 is "D'" and the output signal (Ob) of the checker CPU 120 in the main device 100 is "D," the comparator 150 detects that there is a mismatch between the output signal (Oa) and the output signal (Ob), and the comparison result signal (LE1) is set to a high level, for example.

According to the comparison result signal (LE1) of the comparator 150 in the main device 100, the output signal (Oa) of the master CPU 110 in the main device 100 is switched to the output signal (Oc) of the master CPU 210 in the sub device 200.

According to the signal (Oe) obtained by causing the comparison result signal (LE1) of the comparator 150 in the main device 100 to be delayed by two clock cycles (2CLK), the input of the sub device 200 is switched to the delay-free input signal INc. According to the signal (Oe) obtained by causing the comparison result signal (LE1) of the comparator 150 in the main device 100 to be delayed by two clock cycles (2CLK), the output of the DDDC device 1 (the output of delay circuit 430 of the output control circuit 400) becomes valid.

The second example makes it possible to further reduce the number of flip-flop circuits included in the output control circuit 400, compared to the first example.

Third Example

Figure 6:
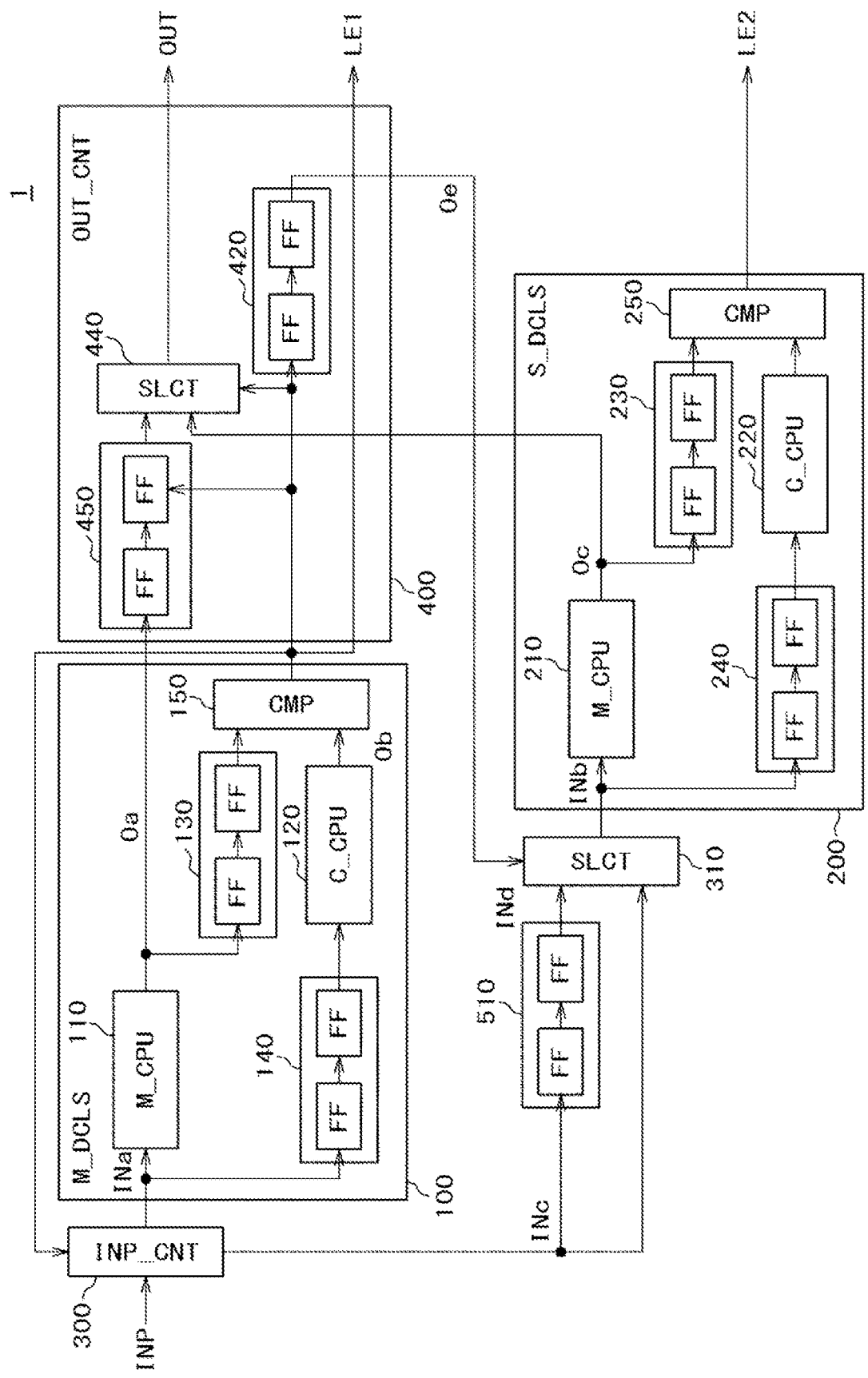
FIG. 6 is a block diagram showing a configuration of a semiconductor device according to a third example of the first embodiment.

FIG. 6 is a block diagram showing a configuration of a semiconductor device according to the third example.

The sub device 200 in the third example operates in a delay of two clock cycles relative to the main device 100 as in the second example. Note that, however, the output control circuit 400 in third example is different in configuration from the output control circuit 400 in the second example. In the following, the differences between the third example and the second example will mainly be described.

The output control circuit 400 in the third example has a delay circuit 450 in the former stage of the selector 440, in place of the delay circuit 430 in the second example. The delay circuit 450 includes a two-stage flip-flop circuit. That is, the delay circuit 450 forms a delay of two clock cycles.

The output signal (Oa) of the master CPU 110 in the main device 100 is delayed by two clock cycles by the delay circuit 450, and is output from the output control circuit 400 as the output signal (OUT). A latter-stage flip-flop circuit of the delay circuit 450 is controlled by the comparison result signal (LE1) of the comparator 150 in the main device 100.

An operation in a case in which an error is detected in the main device 100 will be described with reference to FIG. 5.

The output signal (Ob) of the checker CPU 120 in the main device 100 is delayed by two clock cycles (2CLK) relative to the output signal (Oa) of the master CPU 110. Also, the output signal (Oc) of the master CPU 210 in the sub device 200 is delayed by two clock cycles (2CLK) relative to the output signal (Oa) of the master CPU 110 in the main device 100.

In a case in which the output signal (Oa) of the master CPU 110 in the main device 100 is "D"' and the output signal (Ob) of the checker CPU 120 in the main device 100 is "D," the comparator 150 detects that there is a mismatch between the output signal (Oa) and the output signal (Ob), and the comparison result signal (LE1) is set to a high level, for example.

According to the comparison result signal (LE1) of the comparator 150 in the main device 100, the output signal (Oa) of the master CPU 110 in the main device 100 is switched to the output signal (Oc) of the master CPU 210 in the sub device 200.

According to the signal (Oe) obtained by causing the comparison result signal (LE1) of the comparator 150 in the main device 100 to be delayed by two clock cycles (2CLK), the input of the sub device 200 is switched to the delay-free input signal INc.

The third example makes it possible to further reduce the number of wires to be distributed in the output control circuit 400 and to the output control circuit 400, compared to the second example.

Fourth Example

Figure 7:
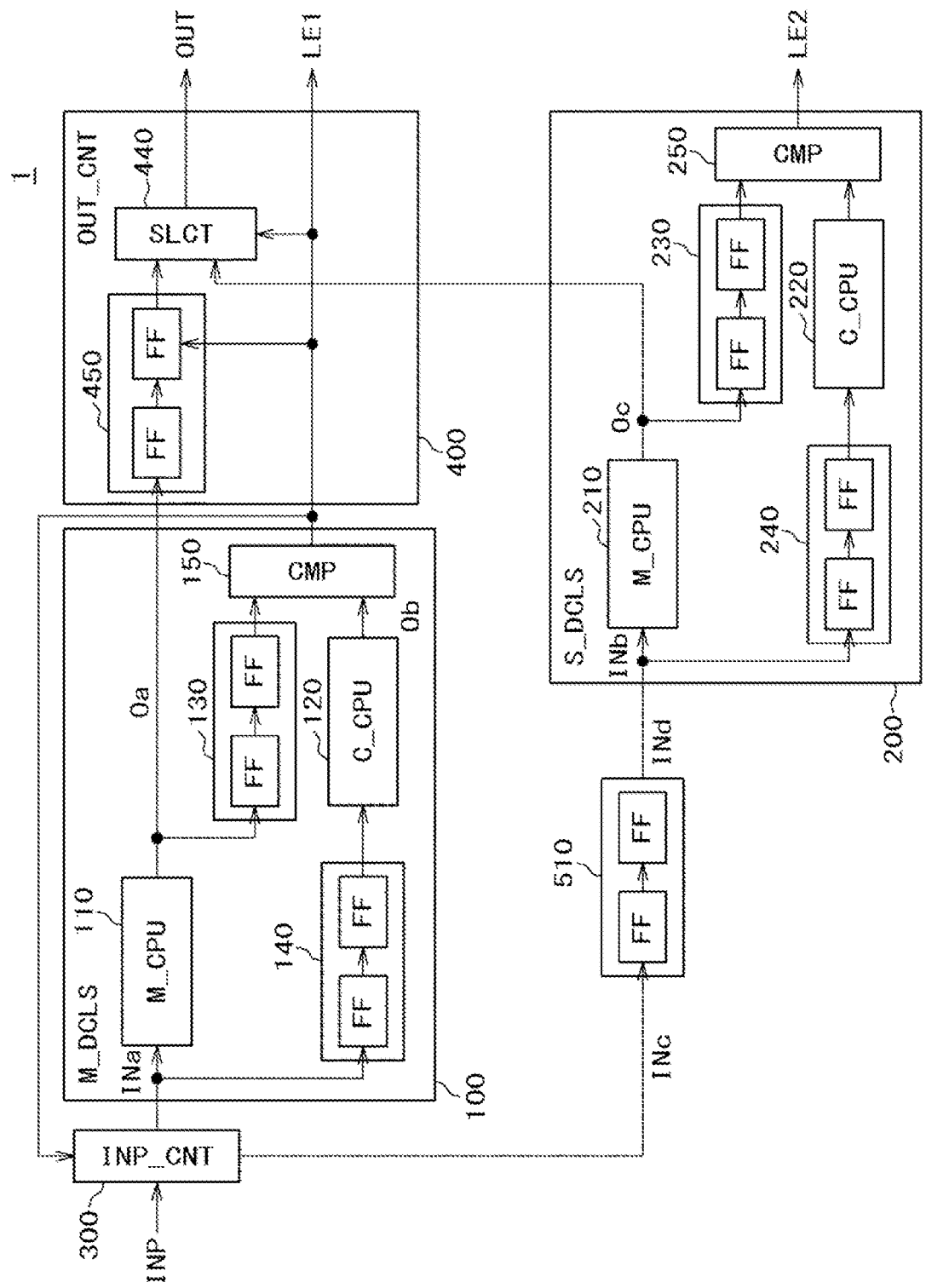
FIG. 7 is a block diagram showing a configuration of a semiconductor device according to a fourth example of the first embodiment.

FIG. 7 is a block diagram showing a configuration of a semiconductor device according to the fourth example.

The sub device 200 in the fourth example operates in a delay of two clock cycles relative to the main device 100, as in the third example. Note that, however, the semiconductor device in the fourth example does not have the selector 310 included in the third example. The input signal (INP) is input to the main device 100 through the input control circuit 300 as the input signal (INa), and is input to the sub device 200 through the delay circuit 510 as the input signal (INd). The delay circuit 510 delays the input signal (INc) to be output as the input signal (INd). In addition, the output control circuit 400 in the fourth example does not have the delay circuit 420 included in the third example.

An operation in a case in which an error is detected in the main device 100 will be described with reference to FIG. 5.

The output signal (Ob) of the checker CPU 120 in the main device 100 is delayed by two clock cycles (2CLK) relative to the output signal (Oa) of the master CPU 110 in the main device 100. In addition, the output signal (Oc) of the master CPU 210 in the sub device 200 is delayed by two clock cycles (2CLK) relative to the output signal (Oa) of the master CPU 110 in the main device 100.

In a case in which the output signal (Oa) of the master CPU 110 in the main device 100 is "D"' and the output signal (Ob) of the checker CPU 120 in the main device 100 is "D," the comparator 150 detects that there is a mismatch between the output signal (Oa) and the output signal (Ob), and the comparison result signal (LE1) is set to a high level, for example.

According to the comparison result signal (LE1) of the comparator 150 in the main device 100, the output signal (Oa) of the master CPU 110 in the main device 100 is switched to the output signal (Oc) of the master CPU 210 in the sub device 200.

The fourth example makes it possible to further reduce the number of flip-flop circuits in the output control circuit 400, compared to the third example, and to eliminate the selector.

Second Embodiment

Figure 8:
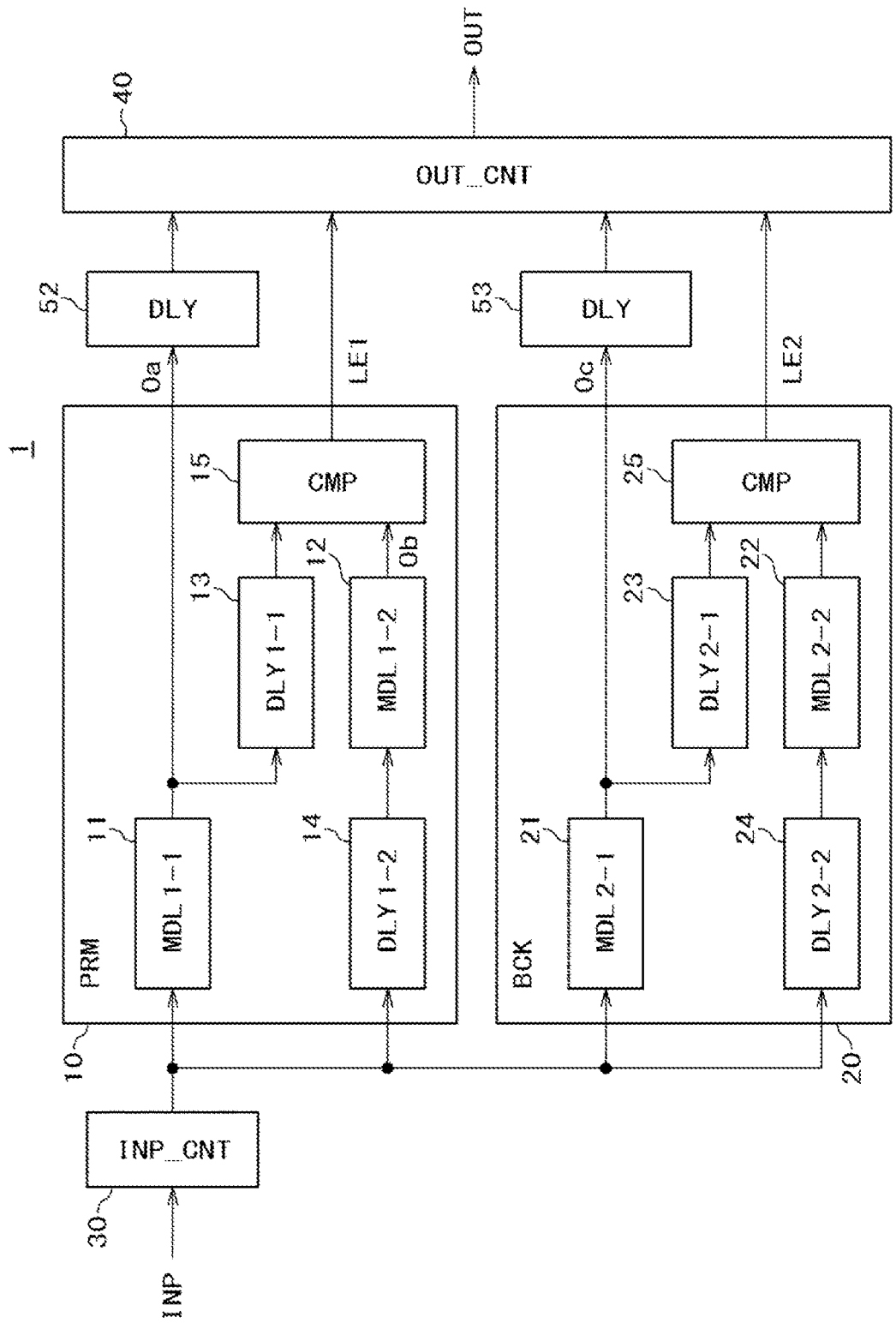
FIG. 8 is a block diagram showing a configuration of a fail operational system according to a second embodiment.

A fail operational system according to a second embodiment will be described with reference to FIG. 8. FIG. 8 is a block diagram showing a configuration of the fail operational system according to the second embodiment.

The fail operational system according to the second embodiment includes the DDDC device 1. The DDDC device 1 includes the primary block (PRM) 10, the backup block (BCK) 20, the input control circuit (INP_CNT) 30, the output control circuit (OUT_CNT) 40, the delay circuit (DLY) 52, and the delay circuit (DLY) 53.

The primary block 10, the backup block 20, and the input control circuit 30 according to the second embodiment each have the same configuration as those of the primary block 10, the backup block 20, and the input control circuit 30 according to the first embodiment, and operate in the similar manner thereto.

The input signal (INP) is input to the primary block 10 and the backup block 20 through the input control circuit 30. At the common time, the backup block 20 performs an operation similar to the primary block 10.

The delay circuit 52 delays the output signal (Oa) of the first module 11 in the primary block 10 and outputs the delayed signal to the output control circuit 40. The delay circuit 53 delays the output signal (Oc) to the first module 21 in the backup block 20 and outputs the delayed signal to the output control circuit 40. An amount of delay of the delay circuit 52 is the number of clock cycles equal to or more than a sum of amounts of delay in the delay circuits 13 and 14.

Similarly, an amount of delay of the delay circuit 53 is the number of clock cycles equal to or more than a sum of amounts of delay in the delay circuits 23 and 24. Accordingly, it is possible to eliminate a difference in timing between the output signal (Oa) of the first module 11 and the comparison result signal (LE1) of the comparator 15. Similarly, it is possible to eliminate a difference in timing between the output signal (Oc) of the first module 21 and the comparison result signal (LE2) of the comparator 25.

The output control circuit 40 outputs a signal obtained by causing the delay circuit 52 to delay the output signal (Oa) of the first module 11 according to the comparison result signal (LE1). Similarly, the output control circuit 40 outputs a signal obtained by causing the delay circuit 53 to delay the output signal (Oc) of the first module 21 according to the comparison result signal (LE2). Accordingly, the operation in the primary block 10 can be switched to the operation of the backup block 20.

Specifically, in a case in which the primary block 10 is normal, the output control circuit 40 selects the signal obtained by causing the output signal (Oa) of the first module 11 in the primary block 10 to be delayed by the delay circuit 52 and outputs the selected signal as the output signal (OUT). In a case in which a trouble is detected in the primary block 10 and the backup block 20 is normal, the output control circuit 40 selects the signal obtained by causing the output signal (Oc) of the first module 21 in the backup block 20 to be delayed by the delay circuit 52 and outputs the selected signal as the output signal (OUT).

As in the first embodiment, with use of the comparison result by the comparator 15 in the primary block 10, the input control circuit 30 controls the input signal to the primary block and the output control circuit 40 controls the output signal from the primary block 10. Hence, the output of false information from the DDDC device 1 can be prevented. Also, during a period of time for a takeover from the primary block 10 to the backup block 20, a protocol with an external device outside the DDDC device 1 can be maintained.

As in the first embodiment, the delayed lockstep technique is applied to the primary block 10 and the backup block 20. Accordingly, it is possible to prevent omission of a failure detection due to lowering of resistance against a common cause failure attributable to distribution of the same signal in each of the primary block 10 and the backup block 20.

Hereinafter, some typical examples according to the second embodiment will be provided. In the following descriptions regarding the examples, components having the same configuration and function as those of the examples of the first embodiment are denoted by the same reference numerals as those of the examples of the first embodiment. In addition, the description of the examples of the first embodiment may appropriately be incorporated into the descriptions of the components having the same configuration and function as those of the examples of the first embodiment as long as there is no technical inconsistency. Also, the multiple examples are entirely or partially applicable in appropriate combination as long as there is no technical inconsistency.

Fifth Example

Figure 9:
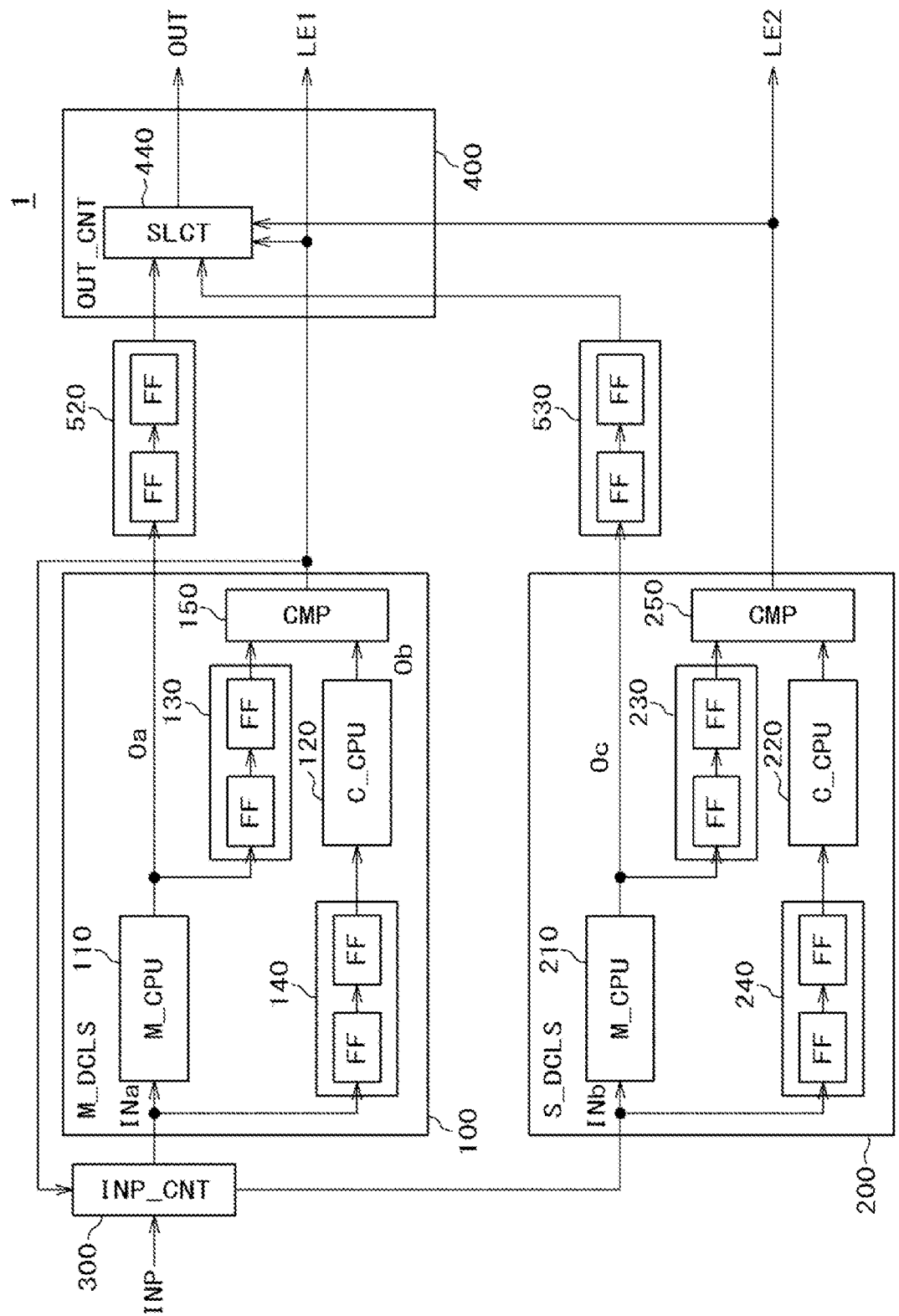
FIG. 9 is a block diagram showing a configuration of a semiconductor device according to a fifth example of the second embodiment.

FIG. 9 is a block diagram showing a configuration of a semiconductor device according to a fifth example.

The semiconductor device according to the fifth example includes the DDDC device 1. The DDDC device 1 according to the fifth example includes the main device 100, the sub device 200, the input control circuit 300, the output control circuit 400, a delay circuit 520, and a delay circuit 530. The main device 100 corresponds to the primary block 10 in the second embodiment. The sub device 200 corresponds to the backup block 20 in the second embodiment. The input control circuit 300 corresponds to the input control circuit 30 in the second embodiment. The output control circuit 400 corresponds to the output control circuit 40 in the second embodiment. The delay circuits 520 and 530 correspond to functions of the delay circuits 52 and 53, respectively.

The main device 100 and the sub device 200 in the fifth example have the similar configurations to those of the main device 100 and the sub device 200 in the first example and operate similarly thereto, respectively. Note that, however, the input signal (INP) is input through the input control circuit 300 to the main device 100 as the input signal (INa) and to the sub device 200 as the input signal (INb). The input signal (INb) is a signal having the same phase as that of the input signal (INa).

Each of the delay circuits 520 and 530 has a two-stage flip-flop circuit. Specifically, each of the delay circuits 520 and 530 forms a delay of two clock cycles.

The output control circuit 400 includes the selector 440. A signal obtained by delaying the output signal (Oa) of the master CPU 110 in the main device 100 by the delay circuit 520 and a signal obtained by delaying the output signal (Oc) of the master CPU 210 in the sub device 200 by the delay circuit 530 are input to the selector 440. The selector 440 is controlled by the comparison result signal (LE1) of the comparator 150 and the comparison result signal (LE2) of the comparator 250. The selector 440 outputs the output signal (OUT) outside the DDDC device 1.

The comparator 150 outputs the comparison result signal (LE1) to the output control circuit 400 and outside the DDDC device 1. The comparator 250 outputs the comparison result signal (LE2) to the output control circuit 400 and outside the DDDC device 1.

Figure 10:
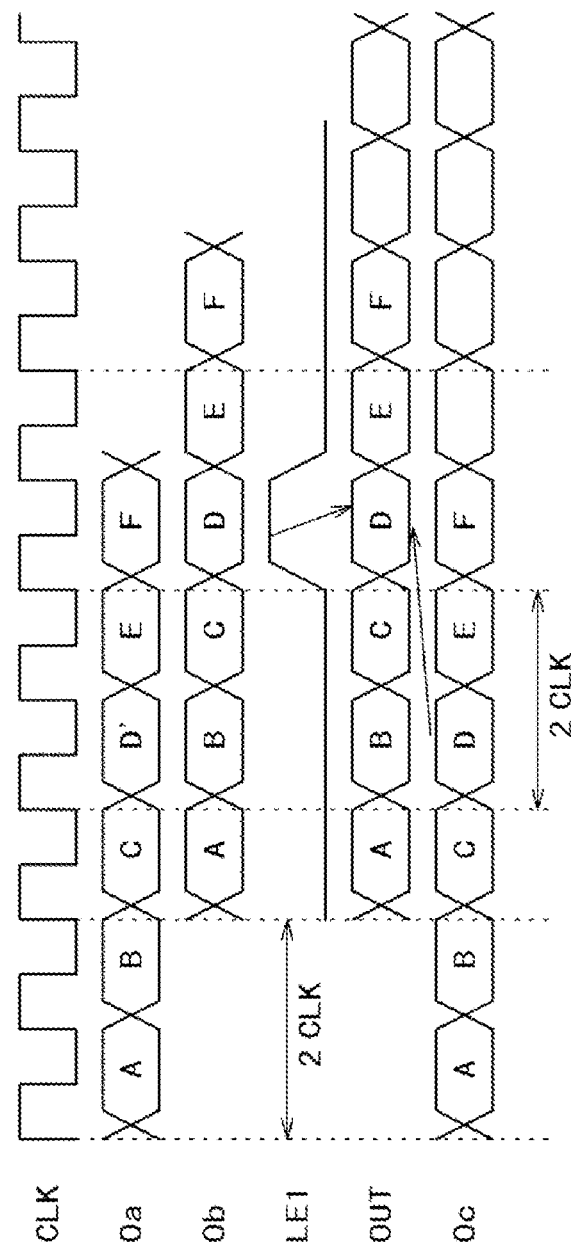
FIG. 10 is a timing chart indicating an operation of a fail operational system shown in FIG. 9.

An operation in which an error is detected in the main device 100 will be described with reference to FIG. 10. FIG. 10 is a timing chart indicating an operation of the semiconductor device shown in FIG. 9.

The output signal (Ob) of the checker CPU 120 in the main device 100 is delayed by two clock cycles (2CLK) relative to the output signal (Oa) of the master CPU 110. Also, the output signal (Oc) of the master CPU 210 in the sub device 200 is delayed by two clock cycles (2CLK) relative to the output signal (Oa) of the master CPU 110 in the main device 100. At a time of normal operation of the main device 100, the signal obtained by delaying the output signal (Oa) of the master CPU 110 by two clock cycles (2CLK) is output as the output signal (OUT).

In a case in which the output signal (Oa) of the master CPU 110 in the main device 100 is "D'" and the output signal (Ob) of the checker CPU 120 in the main device 100 is "D," the comparator 150 detects that there is a mismatch between the output signal (Oa) and the output signal (Ob), and the comparison result signal (LE1) is set to a high level, for example.

According to the comparison result signal (LE1) of the comparator 150 in the main device 100, the output signal (Oa) of the master CPU 110 in the main device 100 is switched to the output signal (Oc) of the master CPU 210 in the sub device 200. At a time of a failure in the main device 100, the signal obtained by delaying the output signal (Oc) of the master CPU 210 by two clock cycles (2CLK) is output as the output signal (OUT).

The comparison result signal (LE1) of the comparator 150 in the main device 100 masks the input of the input signal (INP) to the main device 100. The main device 100 and the sub device 200 output the comparison result signal (LE1) and the comparison result signal (LE2) outside the DDDC device 1, respectively.

Comparative Example

Figure 11:
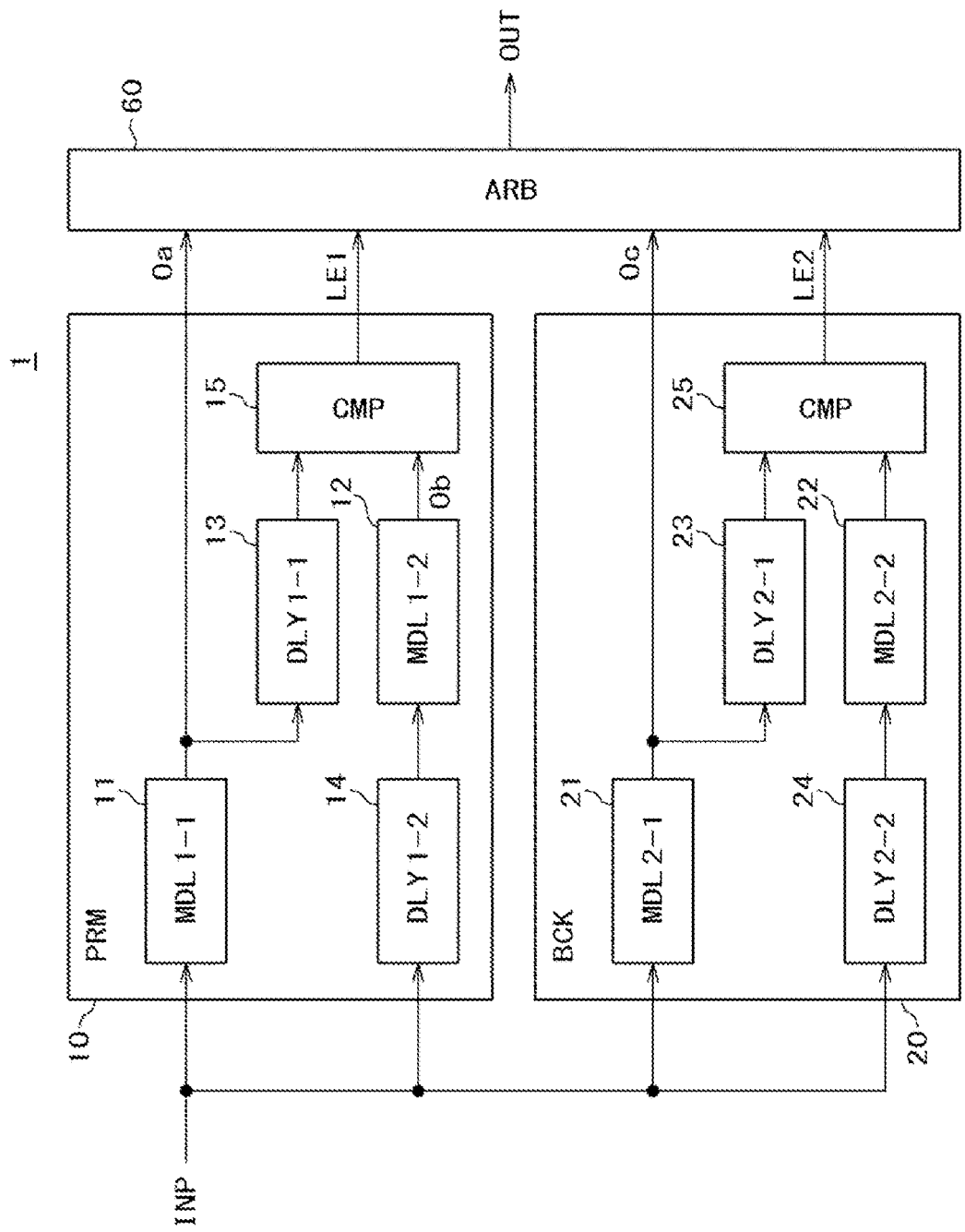
FIG. 11 is a block diagram showing a configuration of a fail operational system according to a comparative example.
Figure 12:
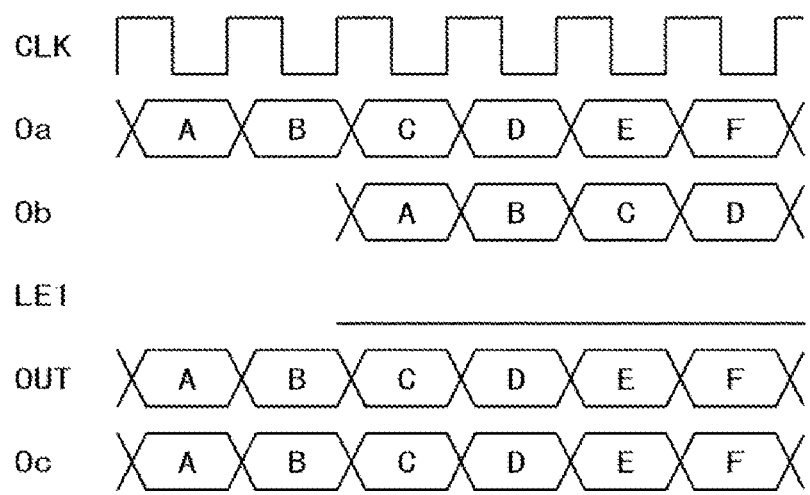
FIG. 12 is a timing chart indicating a normal operation of the fail operational system shown in FIG. 11.
Figure 13:
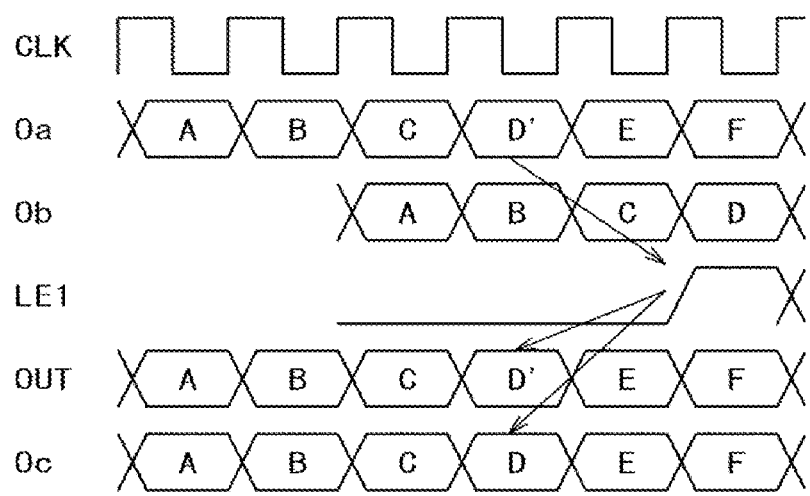
FIG. 13 is a timing chart indicating an operation when a failure is detected in a primary block of the fail operational system shown in FIG. 11.

In order to clarify the present disclosure more, a technique (comparative example) that the present disclosers have studied prior to the present disclosure will be described with reference to FIG. 11 to FIG. 13. FIG. 11 is a block diagram showing a configuration of a fail operational system according to the comparative example. FIG. 12 is a timing chart indicating a normal operation in the fail operational system shown in FIG. 11. FIG. 13 is a timing chart indicating an operation in a case in which a failure is detected in the primary block of the fail operational system shown in FIG. 11.

As indicated in FIG. 11, the DDDC device 1 in the comparative example includes the primary block (PRM) 10, the backup block (BCK) 20, and an arbitration logic (ARB) 60. The input signal (INP) is directly input to the primary block 10 and the backup block 20. Configurations and operations in the primary block 10 and the backup block 20 according to the comparative example are similar to those in the embodiments described above. The DDDC device 1 according to the comparative example does not include the delay circuit 50 in the first embodiment or the delay circuits 52 and 53 in the second embodiment. The DDDC device 1 according to the comparative example does not include the input control circuit 30 and the output control circuit 40 in the first embodiment or the second embodiment.

As indicated in FIG. 12, in the case of the normal operation, contents of the output signal (Oa) of the first module 11, the output signal (Ob) of the second module 12, the output signal (OUT), and the output signal (Oc) of the first module 21 change in order of A, B, C, D, E, and F. Note that, in FIG. 13, due to a failure in the first module 11, the content of the output signal (Oa) of the first module 11 changes in order of A, B, C, D', E, and F.

The output signal (Ob) of the second module 12 in the primary block 10 is delayed by two clock cycles (2CLK) relative to the output signal (Oa) of the first module 11. Also, the output signal (Oc) of the first module 21 in the backup block 20 is output at the same timing as that of the output signal (Oa) of the first module 11 in the primary block 10.

As indicated in FIG. 13, in a case in which the output signal (Oa) of the first module 11 in the primary block 10 is "D'" and the output signal (Ob) of the second module 12 in the primary block 10 is "D," the comparator 15 detects that there is a mismatch between the output signal (Oa) and the output signal (Ob), and the comparison result signal (LE1) is set to a high level, for example.

However, since the comparison result signal (LE1) of the comparator 15 is delayed relative to the output signal (Oa) of the first module 11, a false information output (D') of an output signal (OUT) of the arbitration logic 60 cannot be prevented with use of the comparison result signal (LE1) of the comparator 15. In addition, since the comparison result signal (LE1) of the comparator 15 is delayed relative to the output signal (Oc) of the first module 21 in the backup block 20, it is not possible to continue an operation by switching to the backup block 20 with use of the output signal (Oc) of the first module 21.

In the embodiments (examples) described above, the output of the DDDC device 1 is delayed by the delay circuit 430, the delay circuit 450, or the delay circuit 520, relative to the output signal (Oa) of the first module 11 (master CPU 110). This can prevent the comparison result signal (LE1) that is the output of the comparator 15 (comparator 150) from being delayed relative to the output signal (Oa) of the first module 11 (master CPU 110), and the DDDC device 1 (output control circuit 40) can prevent the output of the false information. In addition, it is possible to switch the operation of the primary block 10 (main device 100) to the backup block 20 (sub device 200).

As described above, the disclosure made by the present disclosers has concretely been described according to the embodiments and the examples. However, it is needless to say that the present disclosure is not to be limited to the above-mentioned embodiments and examples and may be modified in various ways.

In the examples described above, for example, a case in which the first modules 11 and 21 as well as the second modules 12 and 22 are CPUs has been described, they may be other processors such as a DSP (Digital Signal Processor). In addition, the first modules 11 and 21 as well as the second modules 12 and 22 may each include another bus master such as a direct memory access controller (DMAC).

What is claimed is:

1. A semiconductor device comprising:
    a main device which operates in a delayed lockstep mode;
    a sub device which operates in parallel to the main device in the delayed lockstep mode;
    a first delay circuit which delays an output of the main device; and
    a first switching circuit which switches the main device to the sub device according to first failure information of the main device,
    wherein the main device includes a first master central processing unit, a first checker central processing unit, and a first comparator which compares an output of the first master central processing unit with an output of the first checker central processing unit to output the first failure information, and
    wherein the sub device includes a second master central processing unit, a second checker central processing unit, and a second comparator which compares an output of the second master central processing unit with an output of the second checker central processing unit to output second failure information.

2. The semiconductor device according to claim 1, further comprising:
    a delay circuit which delays the sub device relative to the main device in operation.

3. The semiconductor device according to claim 1, wherein an output of the first delay circuit is controlled according to the first failure information.

4. The semiconductor device according to claim 1, further comprising:
    an input control circuit which supplies an input signal to the main device and the sub device,
    wherein the input control circuit is controlled by the first failure information.

5. The semiconductor device according to claim 1, further comprising:
    a switching circuit which switches the output of the main device and an output of the sub device according to the first failure information.

6. The semiconductor device according to claim 5, wherein the first delay circuit delays the output of the sub device.

7. The semiconductor device according to claim 2, further comprising:
- a circuit which controls an input to the sub device according to the first failure information.

8. The semiconductor device according to claim 1, further comprising:
- a second delay circuit which delays an output of the sub device; and
- a second switching circuit which switches an output of the first delay circuit and an output of the second delay circuit according to the first failure information.

9. The semiconductor device according to claim 8, wherein the second switching circuit switches the output of the first delay circuit and the output of the second delay circuit according to the first failure information and the second failure information.

* * * * *